(12) United States Patent
Frantz

(10) Patent No.: US 7,330,341 B2
(45) Date of Patent: Feb. 12, 2008

(54) SUPERCONDUCTING MAGNET COIL SYSTEM WITH QUENCH PROTECTION

(75) Inventor: Wolfgang Frantz, Karlsruhe (DE)

(73) Assignee: Bruker Biospin GmbH, Rheinstetten (DE)

( * ) Notice: Subject to any disclaimer, the term of this patent is extended or adjusted under 35 U.S.C. 154(b) by 68 days.

(21) Appl. No.: 11/540,572

(22) Filed: Oct. 2, 2006

(65) Prior Publication Data

US 2008/0007375 A1 Jan. 10, 2008

(30) Foreign Application Priority Data

Oct. 6, 2005 (DE) .................. 10 2005 047 938

(51) Int. Cl.
*H01F 6/06* (2006.01)
(52) U.S. Cl. ........................ 361/19; 335/216
(58) Field of Classification Search ........ 324/318–320; 361/19; 335/216
See application file for complete search history.

(56) References Cited

U.S. PATENT DOCUMENTS

| | | | |
|---|---|---|---|
| 5,216,568 A | 6/1993 | Harada | |
| 5,644,233 A | 7/1997 | Bird | |
| 6,307,370 B1 | 10/2001 | Schauwecker | |
| 6,563,316 B2 | 5/2003 | Schauwecker | |
| 6,717,781 B2 | 4/2004 | Xu | |
| 6,977,571 B1 | 12/2005 | Hollis | |

FOREIGN PATENT DOCUMENTS

| | | |
|---|---|---|
| EP | 0 144 171 | 1/1990 |
| EP | 1 361 455 | 11/2003 |
| EP | 1 447 858 | 8/2004 |
| GB | 2 411 477 | 8/2005 |
| WO | WO 2004/105058 | 12/2004 |

*Primary Examiner*—Ramon M. Barrera
(74) *Attorney, Agent, or Firm*—Paul Vincent

(57) ABSTRACT

A superconducting magnet coil system comprising a main field coil which is formed from series-connected sections, wherein the conductors of the radially inner sections contain a first superconducting material and have first electric voltage insulation, the conductors of the radially outer sections comprise a second superconducting material and are provided with second electric voltage insulation, wherein the first superconducting material has a higher critical magnetic field than the second superconducting material, and the first voltage insulation has a smaller dielectric strength than the second voltage insulation, and a shielding coil which is connected in series with the main field coil, radially surrounds the main field coil, and comprises conductors of the second superconducting material having the second electric voltage insulation, wherein the main field coil and the shielding coil are superconductingly short-circuited during operation and are protected through several ohmic resistances and/or diodes in case of a quench, is characterized in that the inner sections are protected by at least one ohmic resistance and the outer sections are protected, together with the shielding coil, by one single ohmic resistance.

8 Claims, 3 Drawing Sheets

SUPERCONDUCTING MAGNET COIL SYSTEM WITH QUENCH PROTECTION

This application claims Paris Convention priority of DE 10 2005 047 938.3 filed Oct. 6, 2005 the complete disclosure of which is hereby incorporated by reference.

BACKGROUND OF THE INVENTION

The invention concerns a superconducting magnet coil system with a main field coil which is formed from radially nested, series-connected sections comprising conductors, wherein the conductors of the radially inner sections contain a first superconducting material, and have a first electric voltage insulation, the conductors of the radially outer sections comprising a second superconducting material and having a second electric voltage insulation, wherein the first superconducting material has a higher critical magnetic field than the second superconducting material and the first voltage insulation has, at least in certain areas, a smaller dielectric strength than the second voltage insulation, and with a shielding coil which is connected in series with the main field coil, radially surrounds the main field coil, and comprises conductors which contain the second superconducting material and which are surrounded by the second electric voltage insulation, wherein the main field coil and the shielding coil are superconductingly short-circuited during operation (persistent mode) and are protected by several ohmic resistances and/or diodes in case of breakdown of the superconductivity (quench).

U.S. Pat. No. 5,644,233 discloses a magnet configuration with an actively shielded magnet coil system comprising a radially inner main field coil and a radially outer shielding coil which are protected by resistances.

In particular, in RF applications of superconducting magnet coil systems, a considerable stray field is generated which represents a danger to the surroundings of the magnet. The term "stray" field thereby characterizes the remote field of the magnet coil system which is dominated by the dipole-like field portion. In actively shielded magnet coil systems, the stray field is tailored by a shielding coil which is wound in an opposite direction to that of the main field coil, i.e. with a dipole moment which is opposite to the main field coil, such that the overall dipole moment of the magnet coil system is approximately zero. In the event of a superconduction breakdown, it must be ensured that the spatially defined stray field does not exceed its limit value. The field at the location of the specified 5G line must e.g. be smaller than 5 Gauss even during a quench.

In magnet coil systems without quench protection, the stray field remains in case of a quench. High voltages are thereby generated which can damage the magnet coil system. For this reason, one tries to prevent any damage to the magnet coil system due to current changes and associated voltages during a quench.

Superconducting magnet coil systems therefore generally have a device which diverts the magnetic current from the coil sections, which have become resistive during a quench, via protective elements, e.g. resistors.

M. N. Wilson "Superconducting Magnets" (Oxford University Press) discloses bridging of coil sections of the magnet coil system with ohmic resistances. The magnet coil system is thereby divided into meshes which are connected in series, wherein each mesh comprises a coil section of the magnet coil system and a resistance, thereby generating partial areas with a smaller intrinsic inductance. The currents quickly decay in these partial regions, thereby preventing large voltages. However, in case of a quench, currents of different strengths flow in the different meshes of protective resistances and coil sections, which can produce unacceptable uncompensated excess stray fields.

EP 0 144 171 B1 discloses an actively shielded magnet coil system which comprises a resistance network as protection from excess voltages in case of a quench, wherein parts of the magnet coil system are bridged by ohmic resistances. However, the stray field assumes values which may exceed specifications.

U.S. Pat. No. 5,644,233 therefore proposes a magnet coil system, wherein the main field coil and the shielding coil are divided into an equal number of coil sections and are serially connected in pairs, forming one mesh together with an ohmic resistance, wherein each pair of coil sections of main field and shielding coil, which are connected in series within one mesh, has almost identical dipole moment but of different sign. Each mesh therefore comprises one coil section of the shielding coil and one coil section of the main field coil with similar but opposite dipole moments, and a protective resistance which bridges the two coil sections. In the event of a quench in such a section, the stray field only slightly changes since each mesh is approximately free from dipole moments and only minimally contributes to the stray field irrespective of the current that flows in this mesh. The disadvantage of this method is the large constructive and technical expense for the production of the paired wiring of radially distant coil sections of the magnet coil system, since each coil section of the radially inner main field coil must be wired to one coil section of the radially further outward shielding coil.

U.S. Pat. No. 6,563,316 proposes a magnet configuration, wherein not all of the sections which are bridged by a protective element have a negligible dipole moment. This configuration nevertheless considerably reduces the danger of an excess stray field in the event of a magnet configuration quench. The conventional configuration has an additional, enclosed current path which has a non-vanishing number of windings per unit area and is inductively coupled to at least one coil section. This method is also disadvantageous due to the large constructive and manufacturing expense of paired wiring of radially distant coil sections of the magnet coil system.

It is the underlying purpose of the present invention to propose a magnet coil system which realizes effective quench protection without excess stray fields but with little constructive expense.

SUMMARY OF THE INVENTION

This object is achieved in accordance with the invention in that the radially inner sections of the main field coil are protected by at least one ohmic resistance and/or diode connected in parallel to these sections, wherein the radially outer sections of the man field coil are protected together with the shielding coil by one single further ohmic resistance and/or one single diode.

The inventive magnet coil system is subdivided such that the sections are conventionally protectively wired in the area of the magnet coil system which could be damaged by high voltages. The sections of the magnet coil system, however, which are decisive with respect to stray field compensation are combined as a common block and protected by one single resistance or diode. The main field coil is thereby divided into two areas, i.e. into radially inner sections and radially outer sections. The radially inner sections of the main field coil only minimally contribute to the overall dipole moment of the main field coil and are bridged by at least one resistance. The outer sections of the main field coil which carries the major part of the overall dipole moment of the main field coil, are short-circuited with the shielding coil and protected by one single resistance. Since the dipole moment of the shielding coil is equal to the overall dipole moment of the main field coil but has a negative sign, the overall dipole moment of the main field coil is not compensated for by 100% with this wiring in case of a quench, but the plurality of expensive bridge circuits, disclosed in U.S. Pat. No. 5,644,233, can be omitted. The non-ideally compensated current and dipole moment development in case of a quench produces slight, but assessable, stray field changes which are within tolerable limits. This correction can be taken into consideration for determining the stray field specification. The increased voltages in the outer sections of the main field coil and in the shielding coil during a quench may be accepted due to the relatively high dielectric strength of the second superconducting material. The inventive magnet coil system may therefore have a simple construction, wherein in case of a quench, only small excess stray fields occur, and high voltages are generated only at locations where they can be handled.

In a preferred embodiment, the first superconducting material contains $Nb_3Sn$ and the first voltage insulation comprises a glass fiber or ceramic fiber insulation. The glass fiber or ceramic fiber insulation has low dielectric strength with respect to high electric voltages since it normally contains carbon to render the glass fiber or ceramic fiber insulation more ductile for winding, and due to the open weave structure. When these materials are used, the above-described protective wiring of the inner sections comprising the first superconducting material nevertheless prevents damage to the sections due to voltage breakdown.

In a special embodiment, the first superconducting material has a high-temperature superconductor (HTS) and/or $Nb_3Al$ and the first voltage insulation comprises glass fiber or ceramic fiber insulation.

In a particularly preferred embodiment of the inventive magnet coil system, the second superconductor material contains NbTi and the second voltage insulation comprises enamel insulation. The enamel insulation of the second superconductor material has a relatively high dielectric strength such that any voltage increase in case of a quench has no detrimental effect on the radially outer sections or the shielding coils. This superconducting material is therefore particularly suited for the outer sections of the main field coil and the shielding coil which are bridged using one single resistance or one single diode in accordance with the invention.

The above-described voltage insulations and superconducting materials only describe types of voltage insulation (glass fiber insulation or enamel insulation) or superconducting materials. The thickness and exact composition of the inner sections of the voltage insulations may differ. Different inner sections may also consist of different first superconducting materials or different outer sections of different second superconducting materials. It is also feasible to construct a section of the main field coil from several conductors of different superconductor materials. The only decisive criterion is that each first superconductor material which is provided in the magnet coil system has a voltage insulation which has a smaller dielectric strength than the voltage insulation of the second superconducting material.

The advantages of the inventive magnet coil system can be utilized with particular preference when the overall dipole moment of the radially inner sections of the main field coil are smaller than 15% of the overall dipole moment of all sections of the main field coil. The radially outer sections thereby bear 85% of the overall dipole moment of the main field coil. In case of a quench, at least 85% of the dipole moment of the main field coil are correspondingly compensated for. The inner sections only have a small non-ideally compensated stray field development, corresponding to their dipole moment.

In one special embodiment, each individual radially inner section of the main field coil is protected by one ohmic resistance and/or one diode. This is advantageous for most quenches. The number and type of protective resistances 6,7 can, in principle, be matched to the expected quench behavior. In general, the resistance values of the resistances 6, 7 are in the range of a few ohms.

The magnet coil system is preferably an NMR magnet coil system.

With particular preference, the inventive magnet coil system generates magnetic field strengths of more than 9 Tesla, preferably more than 17 Tesla.

Further advantages of the invention can be extracted from the description and the drawing. The features mentioned above and below may be used individually or collectively in arbitrary combination. The embodiments shown and described are not to be understood as exhaustive enumeration but have exemplary character for describing the invention.

BRIEF DESCRIPTION OF THE DRAWING

FIG. 1b shows a circuit diagram of an inventive magnet coil system in accordance with FIG. 1a;

DESCRIPTION OF THE PREFERRED EMBODIMENT

Figure 1A:
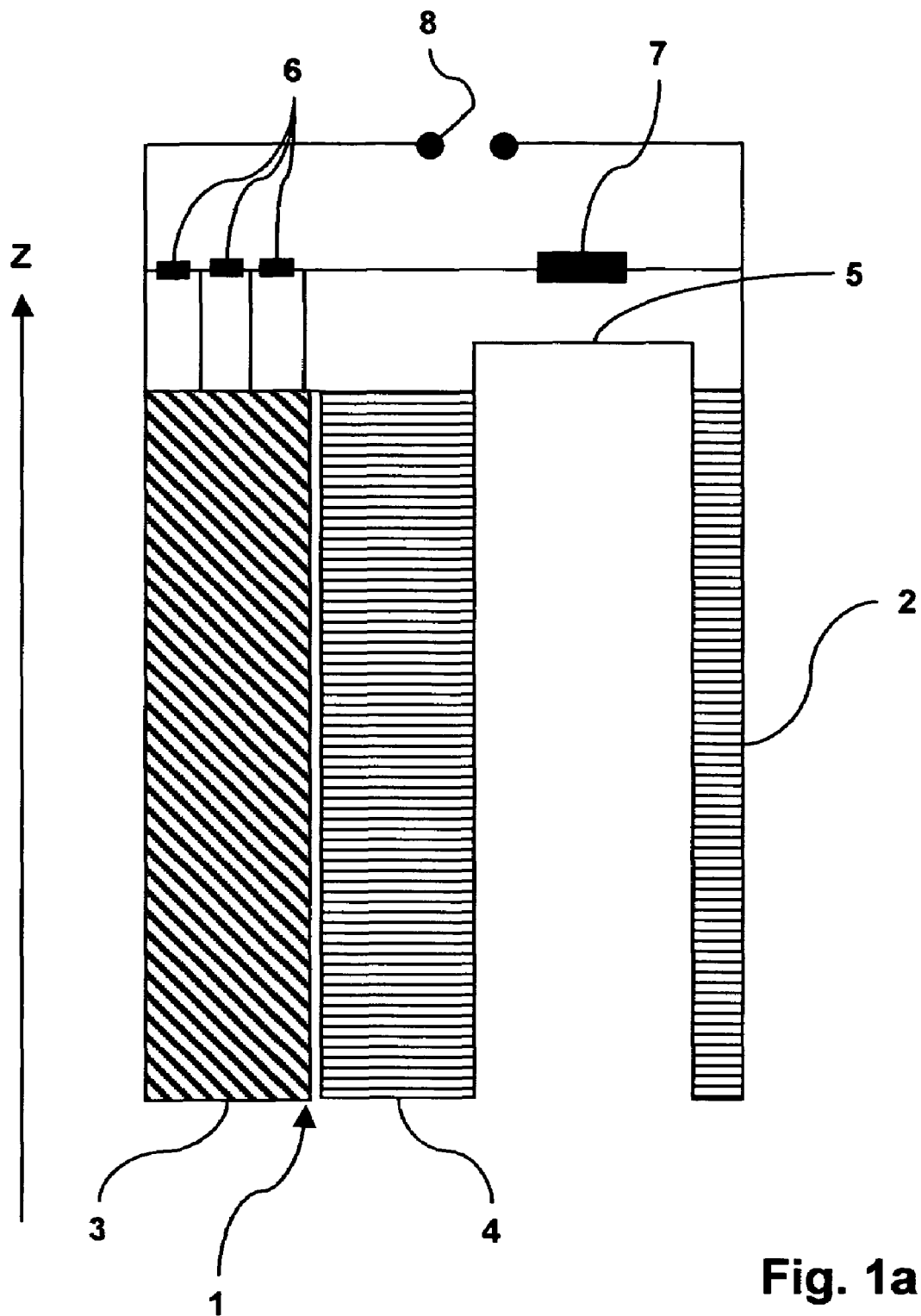
FIG. 1a shows a schematic vertical section through one half of an inventive magnet coil system.
Figure 1B:
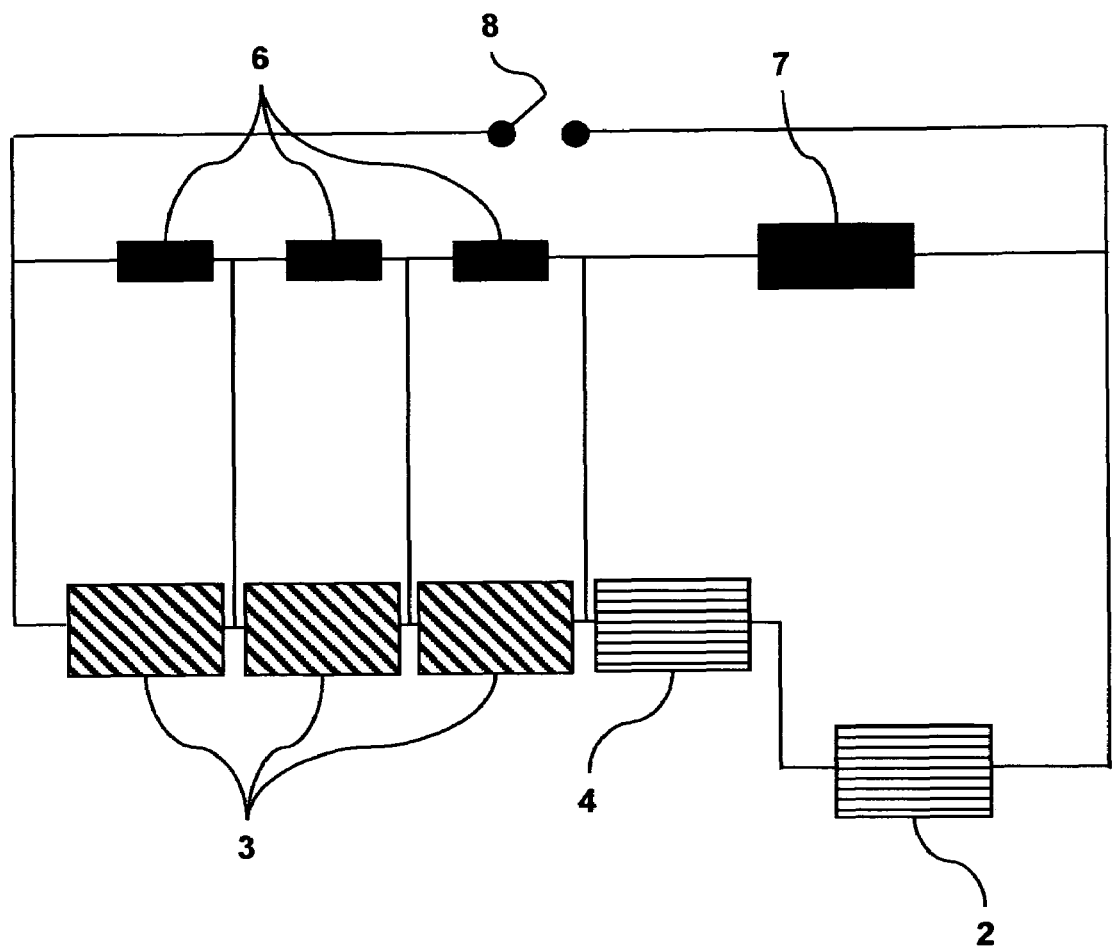

FIG. 1a shows an inventive magnet coil system with a main field coil 1, disposed about the axis z, and a shielding coil 2 which radially surrounds the main field coil 1. FIG. 1b shows a wiring diagram of this magnet coil system. The main field coil and the shielding coil may be short-circuited via a superconducting main switch 8. The main field coil 1 is divided into radially inner sections 3 and radially outer sections 4. The main field coil 1 and the shielding coil 2 are connected in series via an electric connection 5. The inner sections 3 of the embodiments of FIGS. 1a and 1b are divided into three areas which are each bridged by an ohmic resistance 6. This prevents excess voltages in the area of the inner sections 3. The areas of the magnet coil system which are decisive for stray field compensation, i.e. the outer sections 4 and the shielding coil 2 are, in contrast thereto, commonly protected by one single further resistance 7. The voltage may increase during a quench which can, however, be tolerated.

The inner sections 3 which are exposed to the highest field of the magnet coil system are produced from a conductor which is usually annealed at high temperatures following winding, to obtain its superconducting properties (e.g. $Nb_3Sn$, $Nb_3Al$, high-temperature superconductors or a combination thereof). The conductors of the inner sections 3 therefore require heat-resistant insulation (glass fiber or ceramic fiber insulation) which has a relatively small dielectric strength. This property is not problematic in the inventive magnet coil system, since excess voltages can be prevented in the area of the inner sections 3. At the same time, the inner sections 3 have only a small portion of the dipole moment of the main field coil 1 due to their small separation from the z axis. The current distribution in the inner sections 3 therefore has only little influence on the stray field in case of a quench.

In contrast thereto, both the conductors of the radially outer sections 4, which bear the main portion of the dipole moment of the main field coil 1, and the conductors of the shielding coil 2 are preferably produced from NbTi and surrounded by enamel insulation having a considerably higher dielectric strength. The outer sections 4 are connected in series with the shielding coil 2 and are protected, together therewith, by one single ohmic resistance 7. Increased voltages in case of a quench can be better tolerated in this area than in the inner sections 3 of the main field coil 1. This prevents excess stray fields.

The subdivision of the main field coil 1 into inner sections 3 and outer sections 4 may be realized in dependence on the requirements for the stray field. In principle, it is even feasible to design a non-ideal stray field during normal operation, which, however, experiences a smaller excess by the additional stray field generated by the inner sections 3 in case of a quench. The number of protective resistances 6 for the inner sections 3 can also be adjusted to the expected quench behavior. Each inner section 3 typically has one protective resistance 6.

This prevents complex bridge circuits as disclosed in U.S. Pat. No. 5,644,233, and the inner sections 3 which contain the first superconducting material can be protected from excess voltages.

Figure 2A:
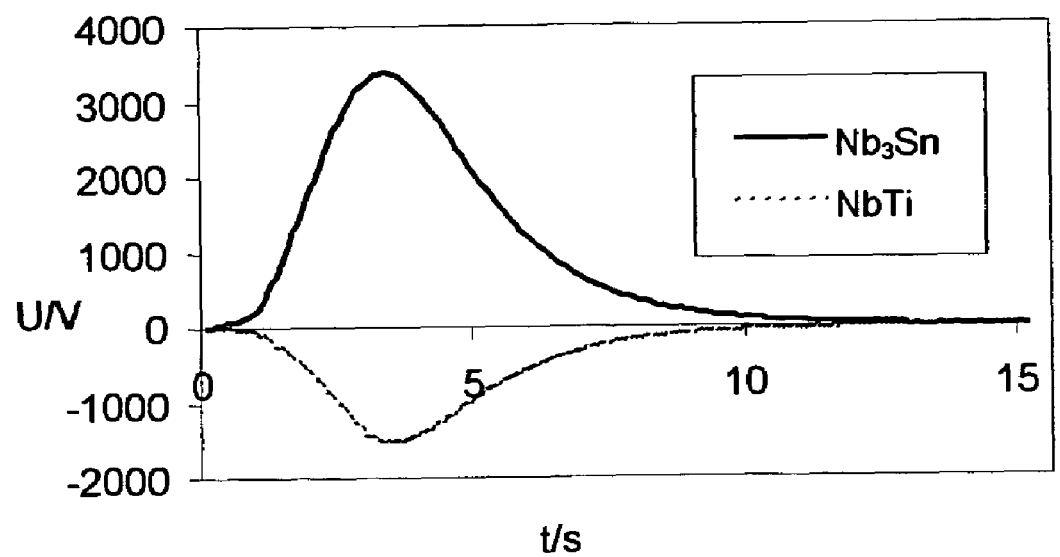
FIG. 2a plots the voltage dependence during a quench within a magnet coil system without quench protection in dependence on time (simulation)

FIG. 2a shows the simulated maximum voltage dependences in case of a quench in the inner sections 3, with $Nb_3Sn$ as first superconducting material (fully drawn line), and in the outer sections with NbTi as second superconducting material (dashed line) for the case of a magnet having no protection circuit in the form of subdivision into separately protected partial areas. The illustrated voltage dependences refer to coil sections from the $Nb_3Sn$ and NbTi area of the main field coil 1 of the magnet coil system. There are further coil sections in these areas whose voltage dependences are not shown, since the voltages are lower and only the maximum values are thereby of interest. One can see that the voltage rises steeply in the $Nb_3Sn$ area up to a maximum voltage of more than 3000V. This enormous voltage increase may damage the inner sections 3, since the voltage insulation of the $Nb_3Sn$ conductor has low dielectric strength.

Figure 2B:
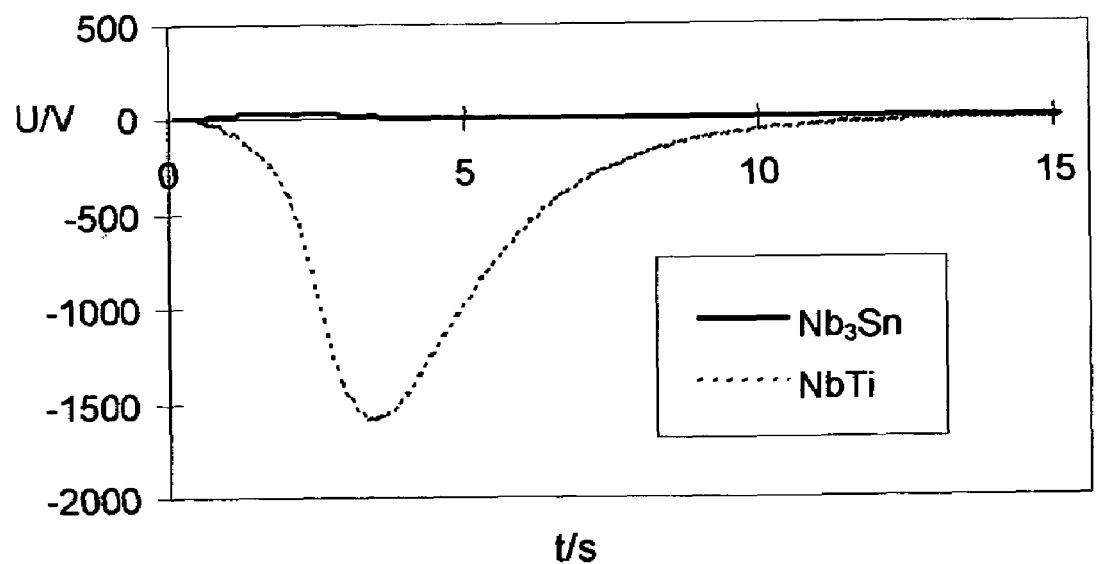
FIG. 2b is a graphic plot of the voltage dependence during a quench within an inventive magnet coil system with quench protection in dependence on time (simulation).

FIG. 2b shows the simulated maximum voltage dependences in case of a quench in the $Nb_3Sn$ area and in the NbTi area of the main field coil 1 when the inner sections 3 ($Nb_3Sn$) of the main field coil 1 have a protective circuit in the form of a subdivision into separately protected partial areas in accordance with the invention. The parameters used for the simulation correspond to those from the simulation for FIG. 2a. The figure also shows only the coil sections having a maximum voltage dependence. While the voltages which occur in the NbTi area are approximately constant compared to the simulation of FIG. 2a, the amount of the voltages occurring in the $Nb_3Sn$ area was reduced by two orders of magnitude using the inventive protective wiring. In this simulation, the radial location e.g. of the 5 Gauss line only increases by at most 13% during a quench.

The inventive magnet coil system realizes quench protection with relatively little constructive expense, while nevertheless counteracting excess stray fields in the relevant areas of the magnet coil system. The inventive wiring of the magnet coil system can, in principle, also be used for laboratory magnets.

LIST OF REFERENCE NUMERALS 1 main field coil
2 shielding coil
3 inner sections
4 outer sections
5 electric connection
6 resistance
7 further resistance
8 superconducting main switch

I claim:
1. A superconducting magnet coil system comprising:
   a main field coil formed from radially nested sections which are connected in series and which comprise conductors, said conductors of radially inner sections of said main coil comprising a first superconducting material and having a first electric voltage insulation, conductors of radially outer sections of said main coil comprising a second superconducting material having a second electric voltage insulation, wherein said first superconducting material has a higher critical magnetic field than said second superconducting material, said first voltage insulation having at least areas of smaller dielectric strength than said second voltage insulation;
   a shielding coil connected in series with and radially surrounding said main field coil, said shielding coil having conductors which contain said second superconducting material and which are surrounded by said second electric voltage insulation, wherein said main field coil and said shielding coil are superconductingly short-circuited during operation;
   at least one ohmic resistance and/or diode connected in parallel with said radially inner sections of said main field coil for quench protection thereof; and
   one single further ohmic resistance and/or one single diode circuited for quench protection of said radially outer sections of said main field coil and of said shielding coil.

2. The superconducting magnet coil system of claim 1, wherein said first superconducting material contains $Nb_3Sn$ and said first voltage insulation comprises a glass fiber or ceramic fiber insulation.

3. The superconducting magnet coil system of claim 1, wherein said first superconducting material comprises a high-temperature superconductor and/or $Nb_3Al$, and said first voltage insulation comprises a glass fiber or ceramic fiber insulation.

4. The superconducting magnet coil system of claim 1, wherein said second superconducting material contains NbTi and said second voltage insulation comprises enamel insulation.

5. The superconducting magnet coil system of claim 1, wherein an overall dipole moment of said radially inner sections of said main field coil is smaller than 15% of an overall dipole moment of all sections of said main field coil.

6. The superconducting magnet coil system of claim 1, wherein each individual radially inner section of said main field coil is protected by an ohmic resistance and/or a diode.

7. The superconducting magnet coil system of claim 1, wherein the magnet coil system is an NMR magnet coil system.

8. The superconducting magnet coil system of claim 1, wherein the magnet coil system generates magnetic field strengths of more than 9 Tesla or of more than 17 Tesla.

* * * * *